(12) United States Patent
Fortier et al.

(10) Patent No.: US 8,384,485 B2
(45) Date of Patent: Feb. 26, 2013

(54) REDUCING SPURS IN INJECTION-LOCKED OSCILLATORS

(75) Inventors: Justin L. Fortier, Carleton Place (CA); Ralph D. Mason, Ottawa (CA)

(73) Assignee: SMSC Holdings S.a.r.l., Luxembourg (LU)

( * ) Notice: Subject to any disclaimer, the term of this patent is extended or adjusted under 35 U.S.C. 154(b) by 138 days.

(21) Appl. No.: 13/097,671

(22) Filed: Apr. 29, 2011

(65) Prior Publication Data

US 2012/0274370 A1 Nov. 1, 2012

(51) Int. Cl.
*H03L 7/001* (2006.01)
(52) U.S. Cl. ......... 331/16; 331/34; 331/177 R; 327/156; 455/73; 455/86; 455/260
(58) Field of Classification Search .................. 327/156; 331/16, 34, 177 R; 455/73, 86, 260
See application file for complete search history.

(56) References Cited

U.S. PATENT DOCUMENTS

| 5,633,582 | A | 5/1997 | Orndorff et al. |
| 5,640,697 | A | 6/1997 | Orndorff |
| 8,041,294 | B2 * | 10/2011 | Rofougaran et al. ........... 455/20 |
| 8,248,172 | B2 * | 8/2012 | Okada et al. .................... 331/57 |
| 2007/0129040 | A1 * | 6/2007 | Adlerstein et al. ............ 455/260 |
| 2009/0072912 | A1 | 3/2009 | Kim et al. |

* cited by examiner

*Primary Examiner* — Arnold Kinkead
(74) *Attorney, Agent, or Firm* — Meyertons, Hood, Kivlin, Kowert & Goetzel, P.C.; Jeffrey C. Hood

(57) ABSTRACT

Various embodiments of a radio-frequency (RF) transmitter receiver circuit that utilizes an injection locked oscillator may allow for the introduction of a DC offset to correct the RF signal. The DC offset may be adjusted to eliminate (or minimize) even order harmonics to correct for RF effects. The DC offset correction may be performed around the injection locked oscillator to target even order terms.

25 Claims, 6 Drawing Sheets

REDUCING SPURS IN INJECTION-LOCKED OSCILLATORS

BACKGROUND OF THE INVENTION

1. Field of the Invention

This invention relates to radio frequency transceiver design, and, more particularly, to decreasing spurious emissions.

2. Description of the Related Art

Radio frequency (RF) transmitters/receivers are used in a wide variety of applications, including wireless network interfaces, mobile telephones, and Bluetooth interfaces. RF transceivers also feature prominently in wireless audio technology directed to headphones and earphones, home audio/theater systems and speakers, portable audio/media players and automotive sound systems. Robust, high-quality audio and low-power RF capability can make it possible for consumer and automotive original equipment manufacturers (OEMs) to integrate wireless audio technology into portable audio devices and sound systems. Overall, various RF technologies lend themselves to a number of applications in the consumer world to create high-fidelity home theater environments and distribute audio in the home and other environments.

A radio communication system typically requires tuned circuits at both the transmitter and receiver. The transmitter is an electronic device that propagates an electromagnetic signal, representative of an audio signal, for example, typically with the aid of an antenna. An RF transceiver is designed to include both a transmitter and a receiver, combined to share common circuitry, many times appearing on the same piece of Integrated Circuit (IC) chip. If no circuitry is common between transmit and receive functions, the combined device is referred to as a transmitter-receiver.

RF Transceivers use RF modules for high-speed data transmission. In most systems, digital processors or processing elements (which are oftentimes software-programmable) are used to perform conversion between digital baseband signals and analog RF, and oscillators are used to generate the required periodic signals. Many RF circuits make use of a voltage-controlled oscillator (VCO), in which the oscillation frequency is controlled by a voltage input, and the oscillation frequency is controlled through an applied DC voltage.

Some systems also use injection-locking for generating the transmission oscillator signal. Injection-Locked Oscillators (ILOs) feature a local oscillator locked to the frequency and phase of an external injection signal under proper conditions, for example when the coupling between the two oscillators is strong enough, and the respective operating frequencies of the two oscillators are close enough. Alternately, ILOs are sometimes configured as Injection Locked Frequency Dividers (ILFDs), in which case the frequency of the input signal is a multiple (or fraction) of the free-running frequency of the oscillator. The locking range of an ILO is inversely proportional to the quality factor of the oscillator circuit, making ILOs sensitive to process variations in integrated circuit designs. In order for the ILO to operate properly, the tuning range of the driving circuit (for example, a VCO) should fall within the input locking range of the ILO.

RF transmitters are prone to RF leakage, causing interference by way of out of band emissions, and spurious emissions. Spurious emissions (or spurs) are signals emitted by a transmitter on a frequency or frequencies which are outside the necessary bandwidth, and typically include harmonics, leakage from the local oscillator and other systems within the transmitter, intermodulation products, and frequency conversion products. The level of permissible out of band emissions and spurious emissions in RF systems are regulated by local regulatory authorities. Therefore, most RF transmitters and/or transceivers attempt to minimize out of band emissions, as well as spurious emissions.

Other corresponding issues related to the prior art will become apparent to one skilled in the art after comparing such prior art with the present invention as described herein.

SUMMARY OF THE INVENTION

A Radio Frequency (RF) system may utilize an Injection-Locked Oscillator (ILO) for generating the transmission oscillator signal. The ILO may be a local oscillator locked to the frequency and phase of an external injection signal when the coupling between the two oscillators is strong enough, and the respective operating frequencies of the two oscillators are close enough. The ILO may be operated to lock to a high order harmonic, and the injection signal may be tracked up to a specified bandwidth. Even order harmonics may be reduced by linking the even order harmonics to the oscillator duty-cycle, linking the duty-cycle to DC offset, and trimming the DC offset to reduce the even order harmonic terms, thereby reducing even-order spurs.

In one set of embodiments, an ILO module within an RF system may include a phase locked loop (PLL) with a Low Frequency Oscillator (LFO), which may be a voltage controlled oscillator (VCO) operating at 200 MHz that provides a source periodic signal, which may be squared up by a hard-limiting buffer, and subsequently amplified—i.e. have its amplitude increased—by a high-gain buffer. The resulting amplified signal may pass through a bandpass filter, which may operate to reject low-order harmonics and the fundamental, and pass the desired harmonic, thus providing the desired injection signal into a Local Oscillator (LO) providing the ILO output signal. The output duty-cycle of the hard-limiting buffer, and therefore the input duty-cycle of the high-gain buffer, may be modified by trimming the DC offset via a digital-to-analog converter (DAC). Introducing a compensation DC offset in the input of the hard-limiting buffer—reducing the second order terms—may compensate for the even order harmonic terms.

The RF system may perform a self-calibration routine before beginning signal transmission, during which trimming is performed on a DC signal to reduce certain RF spurs. Coupling AC terms may still result in even order harmonics giving rise to spurs that aren't necessarily in the DC component of the signal. Therefore, overall calibration may be performed in two stages. A best digital code number may be obtained by trimming the DC offset during a first calibrating stage (e.g. during self-calibration or auto-calibration), and this digital code may be further modified during a second calibrating stage, which may take place during testing, and may be based on actual RF spur measurements. The digital code corresponds to a DAC input, where the DAC is used for trimming the DC offset at the input of the hard-limiting buffer to change the duty-cycle of the source signal ultimately used for generating the injection signal into the LO. The number obtained during the first stage may be modified if testing during the second stage indicates that a problem with spurs still exists. In other words, if the trim number obtained during auto-calibration (or self-calibration) doesn't result in the RF system passing the test during the second stage, the trim number may be overridden, obtaining a new number using RF measurements as opposed to just DC measurements that are performed during the first stage. The modified number may be stored in non-volatile memory. Out of band spurs may therefore be kept below specified levels to meet out of band emission requirements.

Reducing harmonic spurs in ILOs may therefore be accomplished by introducing a DC offset to correct the RF signal, and more specifically, trimming the DC offset to trim out even order harmonics to correct for RF effects. The trimming is performed around the ILO, specifically targeting even order terms.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
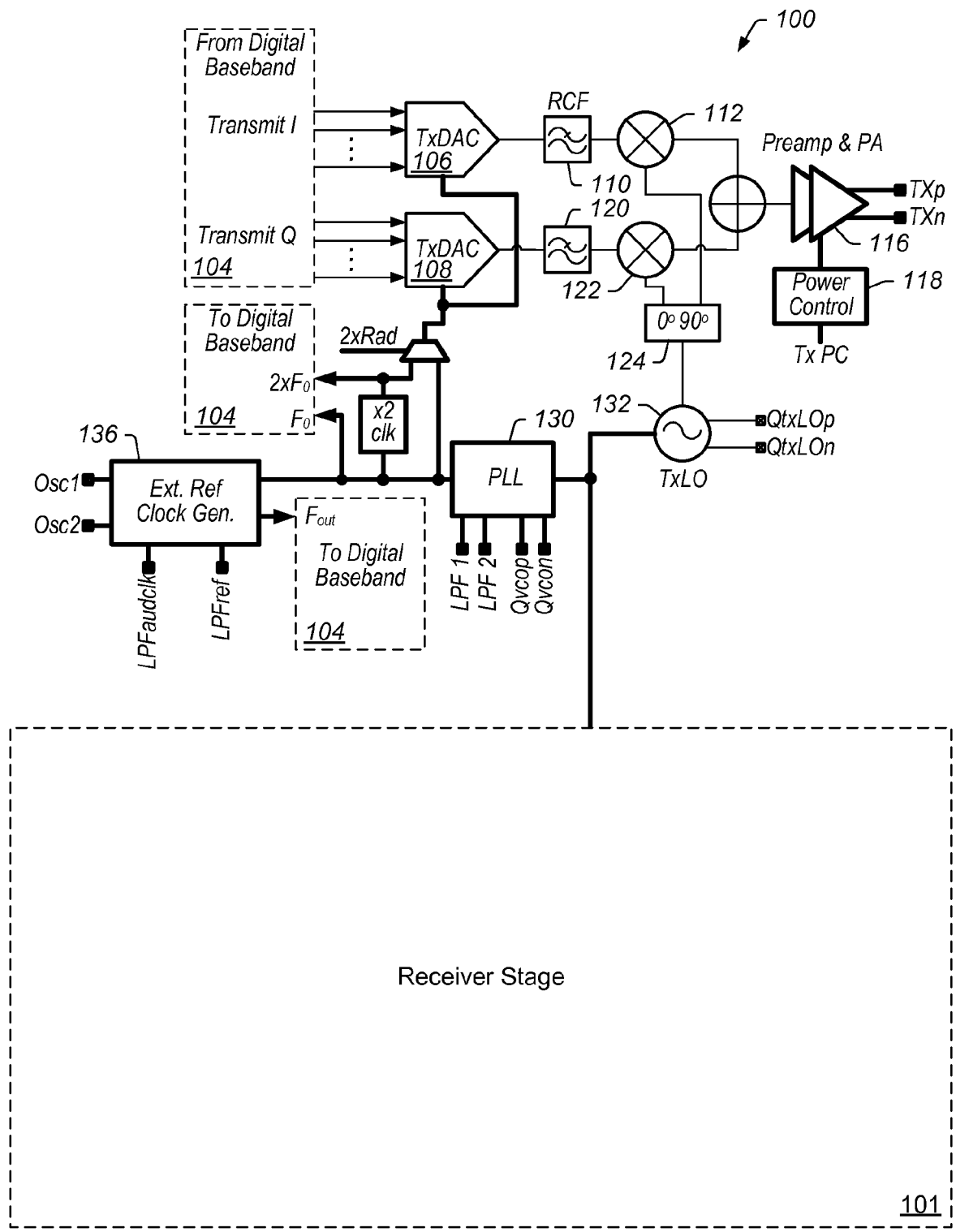
FIG. 1 shows the partial block diagram of one embodiment of an RF system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

FIG. 1 shows the partial block diagram of a radio architecture that includes a radio frequency (RF) transmitter-receiver system according to one embodiment. The transmitter-receiver shown in FIG. 1 includes a transmitter stage 100, and a receiver stage 101. A transmit "I" and a transmit "Q" signal are provided from digital baseband circuitry 104 to digital-to-analog converters (DACs) 106 and 108, respectively, for transmission via amplifier circuitry 116 operating under power control 118. Quadrature modulation is performed by mixers 112 and 122, which are operated according to quadrature signals based on the output of Transmitter Local Oscillator (TxLO) 132, fed through phase shifter 124 to provide the quadrature phase shift. The outputs from DAC 106 and DAC 108 each pass through respective RC filters 110 and 120 before reaching respective mixers 112 and 122. A reference clock generation circuit 136 is used to provide a square wave signal as first base frequency $F_0$ (e.g. a low frequency of approximately 22.5 MHz) periodic signal to phase-locked loop (PLL) 130. Circuit 136 is also used to provide a base frequency $F_{out}$ periodic signal to digital baseband circuitry 104. TxLO 132 may be an injection locked oscillator controlled from PLL 130. Any numeric values provided with respect to the RF system shown in FIG. 1 are exemplary, and various embodiments are not meant to be limited to the specific values provided herein.

Figure 2:
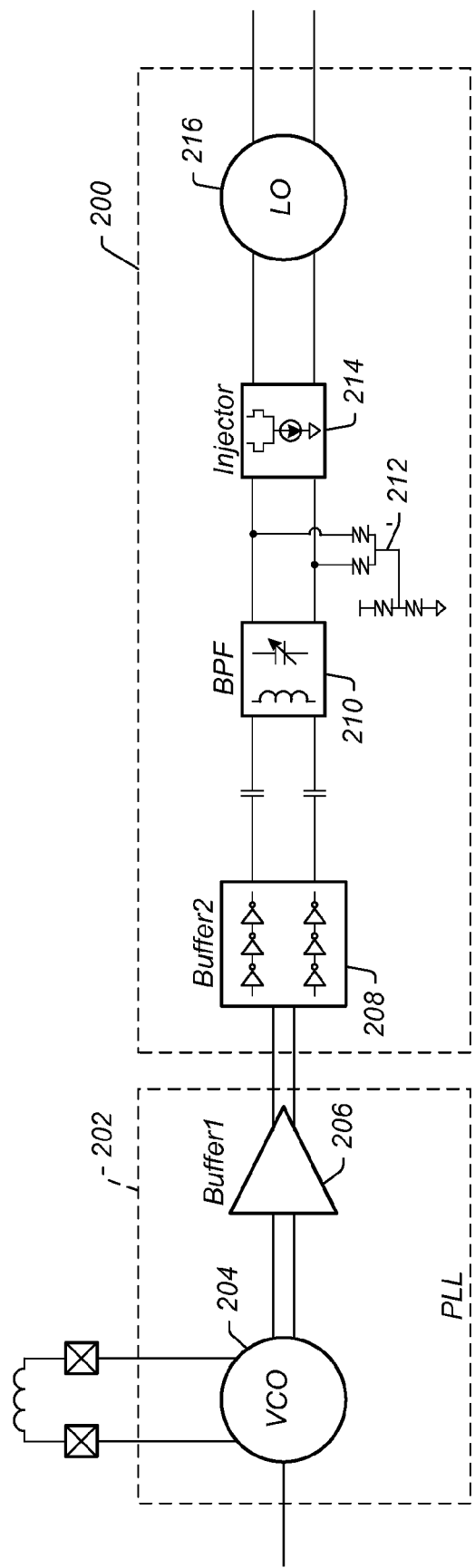
FIG. 2 shows one embodiment of an injection-locked oscillator used in the system of FIG. 1.

The RF system shown in FIG. 1 may be designed to operate in a specific frequency range, and be subject to out of band emission restrictions imposed by local regulatory commissions. As shown in the embodiment of FIG. 1, and as indicated above, RF transmitter 100 includes a Transmitter Local Oscillator (TxLO) 132. The output signal of TxLO 132 may be generated by injection-locking an RF oscillator. The injection-locking signal for generating the TxLO 132 output signal may be the $n^{th}$ harmonic (e.g. the $11^{th}$ harmonic) of a synthesized source, which may operate around a specified lower frequency (e.g. 220 MHz) during transmission. One embodiment of an injection-locking oscillator 200 that may be used in transmitter 100 of FIG. 1 (e.g. as TxLO 132) is shown in FIG. 2. The aforementioned synthesized source may employ a voltage-controlled oscillator (VCO) 204 in a fractional-N PLL 202. In some embodiments, PLL 202 may correspond to PLL 130 shown in FIG. 1. Hard-limiting buffer 206 and high-gain buffer 208 may generate a harmonically rich (rail-to-rail) version of the output of VCO 204. In one embodiment, VCO 204 is operated at 218.18 MHz, while Local Oscillator (LO) 216 outputs a signal at 2.4 GHz. The bandpass filter (BPF) 210 and LO 216 may be tuned to a specified ($n^{th}$) harmonic (e.g. $11^{th}$ harmonic) of the output of PLL 202, using resistor network 212, with injector circuit 214 locking the output signal LO 216. Even order harmonics around the injection signal, i.e., $[n-1]^{th}$ and $[n+1]^{th}$ harmonics (e.g. $10^{th}$ and $12^{th}$ harmonics for n=11) may be offset from the carrier frequency by a value that approximates the operating frequency of VCO 204 (e.g. ~220 MHz). These harmonics may be ideally suppressed by the differential nature of the injection path provided by Injector 214. However, any mismatch in the differential path may cause the even order terms to increase in amplitude. Random mismatch in the injection path may generate offsets that are both AC and DC in nature, (e.g., MOSFET threshold voltage and capacitive mismatch). These offsets may distort the output duty-cycle of high-gain buffer 208, which plays a role in defining the harmonic amplitude of even order terms into the Injector circuit 214.

For example, spurious even harmonic emissions around the $11^{th}$ harmonic (referenced herein as 10/11 spur for $10^{th}$ harmonic, and 12/11 spur for $12^{th}$ harmonic, respectively) may reach levels of 4% to 10%. It may be desirable to reduce these emissions to considerably lower levels, e.g. to levels of 0.3% or lower. Considering that the duty-cycle of the output of high-gain buffer 208 plays a role in defining the harmonic amplitude of even order terms into injector circuit 214, the Fourier Series expansion of a square wave with arbitrary duty-cycle may be expressed by the equation:

$$Amp(Hn) = \frac{A*2*\sqrt{2*(1-\cos(2*\pi*Hn*D))}}{\pi*Hn}, \quad (1)$$

where: 'Hn' refers to the harmonic number (e.g. Hn=11 in reference to the $11^{th}$ harmonic), 'A' is the amplitude of the square wave, and 'D' is the duty-cycle of the square wave.

Figure 3:
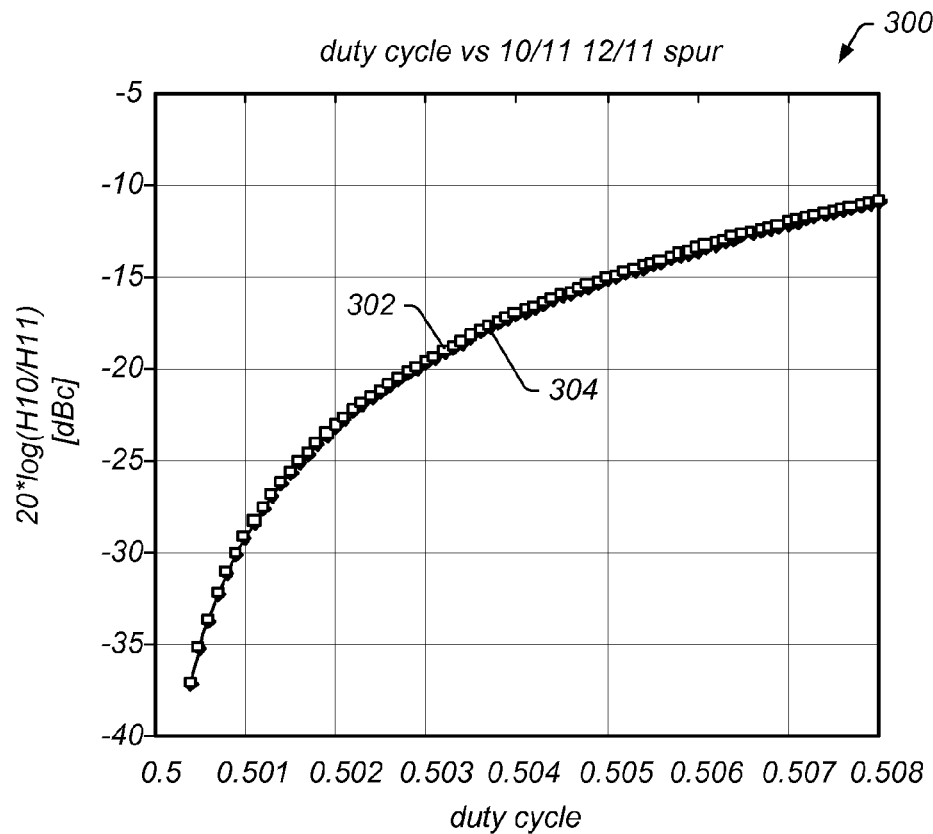
FIG. 3 shows the ratio of the 10th and 12th harmonic amplitude to that of the 11th harmonic (in dBc) with respect to varying duty-cycle.
Figure 4:
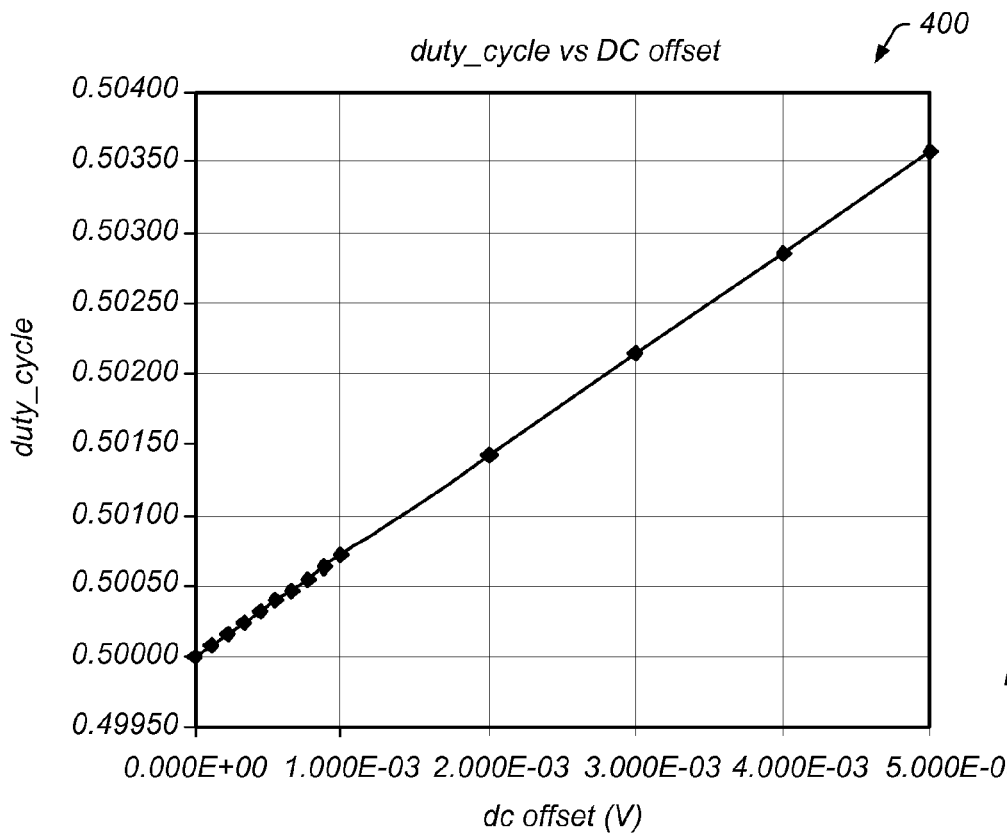
FIG. 4 shows a linear transfer function of DC offset referred to the input of the hard-limiting buffer in FIG. 2, to duty-cycle at the output of the high-gain buffer in FIG. 2.

FIG. 3 shows a diagram illustrating the ratio of the $10^{th}$ and $12^{th}$ harmonic amplitude to that of the 11th harmonic (in dBc) with respect to varying duty-cycle. Graph curve 302 represents the ratio of the $10^{th}$ harmonic with respect to varying duty-cycle, while graph curve 304 represents the ratio of the $12^{th}$ harmonic with respect to varying duty-cycle. The values shown in FIG. 3 are for exemplary purposes, as relating to component values used in one embodiment of the oscillator circuit shown in FIG. 2. As seen in FIG. 3, a duty-cycle value of 50.08% corresponds to a value less than −30 dBc for the ratio [20*log(H10/H11)]. Since the injection path is differential, random DC offset in the path is likely manifested in duty-cycle distortion. FIG. 4 shows a linear transfer function of DC offset (referred to the input of hard-limiting buffer 206) to duty-cycle at the output of high-gain buffer 208.

In one set of embodiments, for an injection locked oscillator (e.g. TxLO 132 in FIG. 1 and oscillator 200 in FIG. 2) locking to high order (odd) harmonic frequencies, the injection signal may be tracked up to a certain bandwidth, while even order harmonics are not fully rejected. However, the even order harmonics may be linked to oscillator duty-cycle, as show in equation (1) above. Furthermore, the duty-cycle of the oscillator signal may be linked to a DC offset, and the DC offset may be trimmed out to reduce the even order harmonic term(s), reducing spurs in the next harmonic. As previously shown in FIG. 2, an oscillator signal generated by PLL 202 from an output provided by VCO 204 may be squared up by a high-gain buffer 208, producing an output signal that may pass through a bandpass filter 210, which may reject low-order harmonics in the fundamental, while passing the desired harmonic. The duty-cycle of hard-limiting buffer 206 may be modified by trimming the DC offset. This may compensate for even order harmonic terms by introducing a known DC offset in the input of hard-limiting buffer 206, trimming the even order terms.

Figure 5:
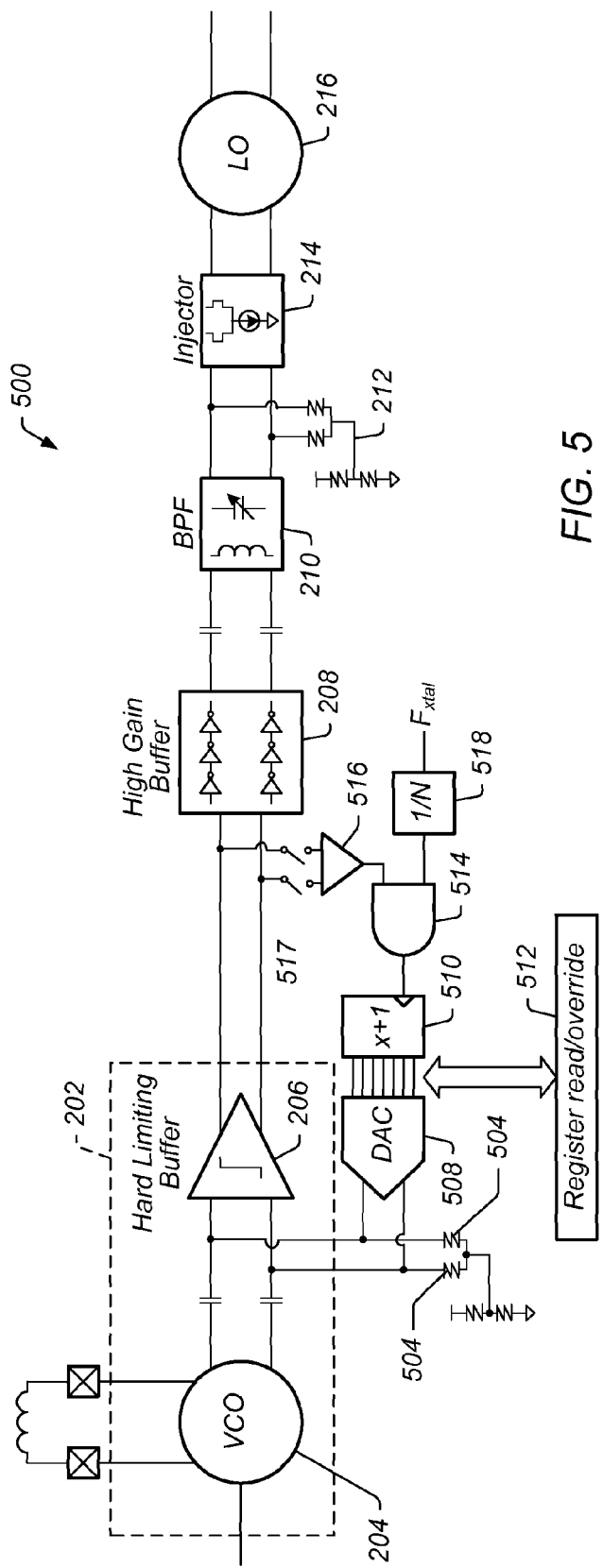
FIG. 5 shows one embodiment of the oscillator circuit shown in FIG. 2, modified to allow for calibration to reduce spurious emissions.

FIG. 5 shows one embodiment of an oscillator circuit 500, including the oscillator circuit from FIG. 2 modified to allow for calibration to reduce spurious emissions, i.e. spurs. Hard-limiting buffer 206 may be designed in such a way that its output duty-cycle may be trimmed by performing a DC calibration. The circuit of buffer 206 may therefore be designed to remain as insensitive to small capacitive (e.g. 5 fF-10 fF) mismatch as possible. Buffer 208 may incorporate an enable/disable mechanism that is independent from the enable/disable mechanism used by PLL 202. This may allow PLL 202 to settle before injection locking LO 216. The offset contribution of buffer 208 may be insignificant when referring it to the input of buffer 206, as shown. The AC coupling between buffer 206 and VCO 204 allows for the use of a current DAC 508 for performing the calibration. The DC offset may be trimmed by developing a differential voltage across the common-mode bias resistors 504. The component values may be specified such that the high pass pole has a corner frequency that allows the output of VCO 204 to remain unattenuated.

The value of common-mode resistors 504 may be specified/selected to be low enough in resistance to keep the currents for DAC 508 at levels that are not within the MOSFET leakage current levels (i.e., 10's of nA). For example, a corner frequency of 100 MHz and resistor value of 1 kΩ may correspond to an AC coupling capacitance of 1.6 pF. In other words, a corner frequency of 100 MHz and resistor value of 1 kΩ may lead to specifying an AC coupling capacitance of 1.6 pF.

Calibration DAC 508 may be operated to trim a specified maximum voltage amount, for example +/−10 mV at the input of Buffer 206, which may be designed to have a lower inherent input referred DC offset. The Least Significant Bit (LSB) may be generated to have a value that is sufficiently small to result in a residual DC offset that is low enough to prevent the output referred offset from significantly corrupting the threshold point of buffer 208. For example, an 8-bit DAC 508 may give:

$$\text{LSB}=20 \text{ mV}/2^8 = 78 \text{ μV}, \quad (2)$$

which corresponds to an LSB current of 234 nA developed across 330Ω. When the calibration procedure is finished, DAC 508 may retain its output value. DAC 508 may further be designed to prevent any output noise from DAC 508 from having an effect on the phase noise of VCO 204.

Counter 510 may step DAC 508 through all of its codes until DC offset is minimized. In one set of embodiments, counter 510 may start at full-scale, negative code upon the start of the calibration procedure, referenced as "calibration start". From there, counter 510 may count up synchronously with the input clock received from clock generation unit 518, which may operate according to an input signal of a specific frequency $F_{xtal}$ received from a crystal. When the output of buffer 206 crosses a specified threshold, e.g. 0V (specifically, a differential voltage value of 0V across the output terminals of buffer 206), counter 510 may be stopped. Counter 510 may also be designed to retain its last value when disabled. An enable signal for counter 510 may be connected to an offset sensing comparator 516, which may be used to gate the clock signal from clock generator circuit 518, via AND gate 514. Comparator 516 may sense when the output of buffer 206 has crossed the specified threshold value (e.g. 0V threshold), and amplify its input to full digital levels, within one clock period. Counter 510 may have the same number of bits as DAC 508. When counter 510 reaches its full-scale value, it may saturate, signaling that calibration is complete. The inputs of comparator 516 may be passed through switches 517 to isolate it from the high frequency signals seen at the output of hard-limiting buffer 206. The switches are closed during calibration, and may remain open, thus residing in a high impedance state during normal transmitter operation.

Figure 6:
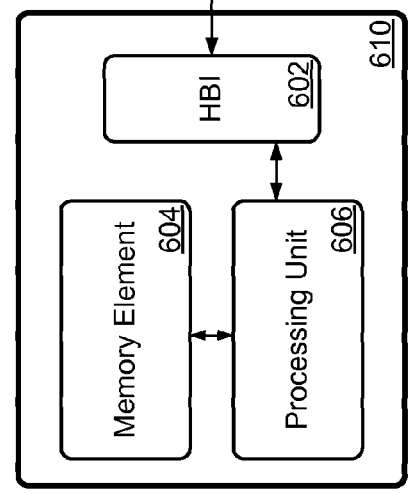
FIG. 6 shows a partial block diagram of one embodiment of a system capable of performing a self-calibration routine for the injection-locked oscillator.

In one set of embodiments, an RF system (e.g. as shown in FIG. 1) that includes the oscillator circuit shown in FIG. 5 may be designed to perform a self-calibration routine before starting transmission, to trim the DC offset. FIG. 6 shows the partial block diagram of one embodiment of a system that includes the transceiver shown in FIG. 1, and which can implement the self-calibration (or calibration) routine. The calibration routine may be initiated in a variety of ways, for example it may be started after initial boot of the system but before entering radio application or transmission mode, i.e. prior to transmitting any data. For example, RF system 612, which may include the transmitter (100) and receiver (102) components of the RF system shown in FIG. 1, may couple to components of a host system 610 through a host bus interface (HBI) 602. Host system 610 may include one or more memory elements 604 that store program code executable by a processing unit 606 (which may be a general purpose central processing unit, or a microcontroller or some similar component) to perform the initial calibration routine upon boot up, prior to commencing data transmission. In such cases, a signal to processing unit 606 from transmitter 100 may indicate when calibration is complete. Referring again to FIG. 5, the code produced by DAC 508 may be saved in non-volatile memory (e.g. memory element 604, or some other memory element included in either host system 610 or RF system 612), allowing the calibration routine to be run once, without having to run after every reset.

In one set of embodiments, a contingency to meeting the spur specification through the self-calibration routine described above is the ability to trim the spurs during production testing of the RF system. An algorithm to trim the spurs during production testing of the RF system may depend on the ability to measure spurs, i.e. measure RF signals, with an instrument (or tester resource) that is capable of capturing signals at the required frequency, that is, at a frequency higher than the operating frequency of LO 216, at an appropriate, or sufficiently high resolution. For example, when LO is operating at 2.4 GHz, the signal may be captured at ~3 GHz, with the resolution to measure signals at the specification level of −32 dBm/MHz (or better). The relationship between the spur level (in dB) and the DAC code values (DAC output values) according to one possible embodiment is illustrated in the diagrams shown in FIGS. 7A through 7C.

Figure 7B:
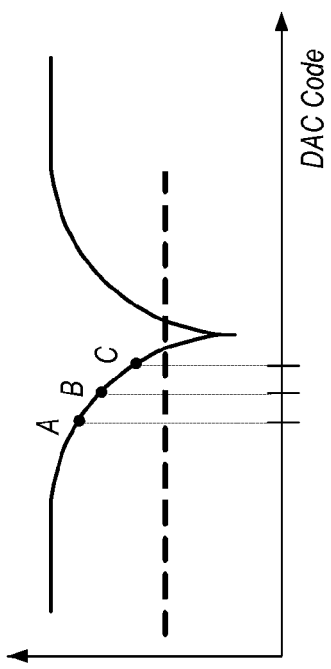
FIG. 7B illustrates the relationship between the spur level (in dB) and the DAC code values when employing a search algorithm that is incrementing DAC codes to find the spur specification level.
Figure 7C:
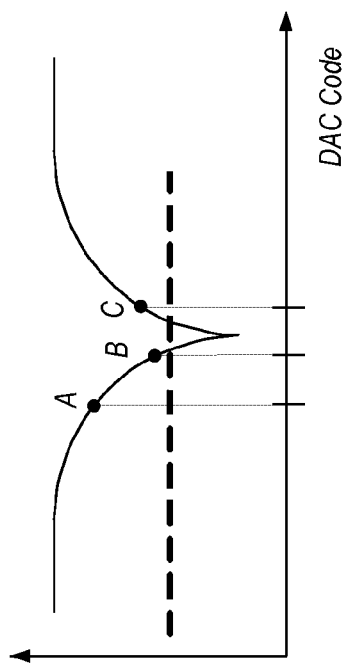
FIG. 7C illustrates the relationship between the spur level (in dB) and the DAC code values when the specification level is "bracketed" by the three consecutive measurements.
Figure 7A:
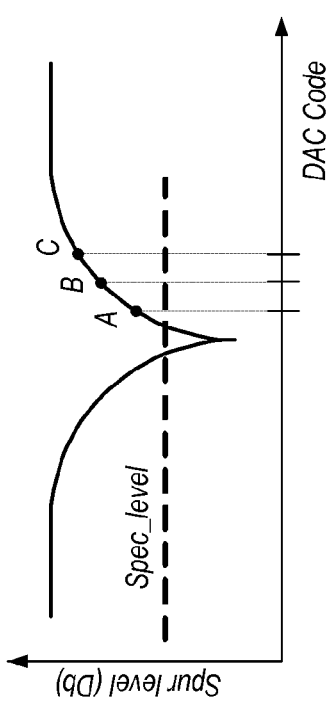
FIG. 7A illustrates the relationship between the spur level (in dB) and the DAC code values when employing a search algorithm that is decrementing DAC codes to find the spur specification level.

FIG. 7A illustrates the relationship between the spur level (in dB) and the DAC code values when employing a search algorithm that is decrementing DAC codes to find the spur specification level, using the DAC code saved at the end of the self-calibration routine as the starting point. In other words, the starting value provided to the DAC by the counter at the beginning of the search algorithm corresponds to the code (number) saved at the end of the self-calibration routine. The spur level at point B corresponds to the DAC code saved at the end of the self-calibration routine (referred henceforth as the starting DAC code value), while the spur level at point A corresponds to the starting DAC code value minus a specified step (N), and the spur level at point C corresponds to the starting DAC code value plus a specified step (N). Referring again to the embodiment shown in FIG. 5, the DAC code may be overwritten via register read/override block 512 when performing the search algorithm. In other words, instead of accepting the code from counter 510, DAC 508 may receive the code from block 512, which itself may be coupled to host system 610, as exemplified in FIG. 6.

FIG. 7B illustrates the relationship between the spur level (in dB) and the DAC code values when employing a search algorithm that is incrementing DAC codes to find the spur specification level. The spur level at point A corresponds to the starting DAC code value, while the spur level at point B corresponds to the starting DAC code value plus a specified step (N), and the spur level at point C corresponds to the starting DAC code value plus twice the specified step (2N).

FIG. 7C illustrates the relationship between the spur level (in dB) and the DAC code values when the specification level is "bracketed" by the three consecutive measurements. The spur level at point A again corresponds to the starting DAC code value, while the spur level at point B again corresponds to the starting DAC code value plus a specified step (N), and the spur level at point C again corresponds to the starting DAC code value plus twice the specified step (2N).

Therefore, in one set of embodiments, an algorithm may be devised to search for the spur minimum. The algorithm may be designed to determine which of the search strategies (or cases) to follow from the strategies illustrated in FIGS. 7A through 7C. The strategy (or case) illustrated in FIG. 7C may be considered a special case that uses a "Golden Section Search" to find the notch representing the desired spur level. An optimal step size (N) for the DAC code values may be specified such that a minimal number of measurements are required. N may be an integer value corresponding to a single or multiple unit step difference in DAC input value. A value (k) may also be specified for the maximum number of measurements to be taken before failing the system, when the measurements fail to successfully reach the desired spur value.

Figure 8:
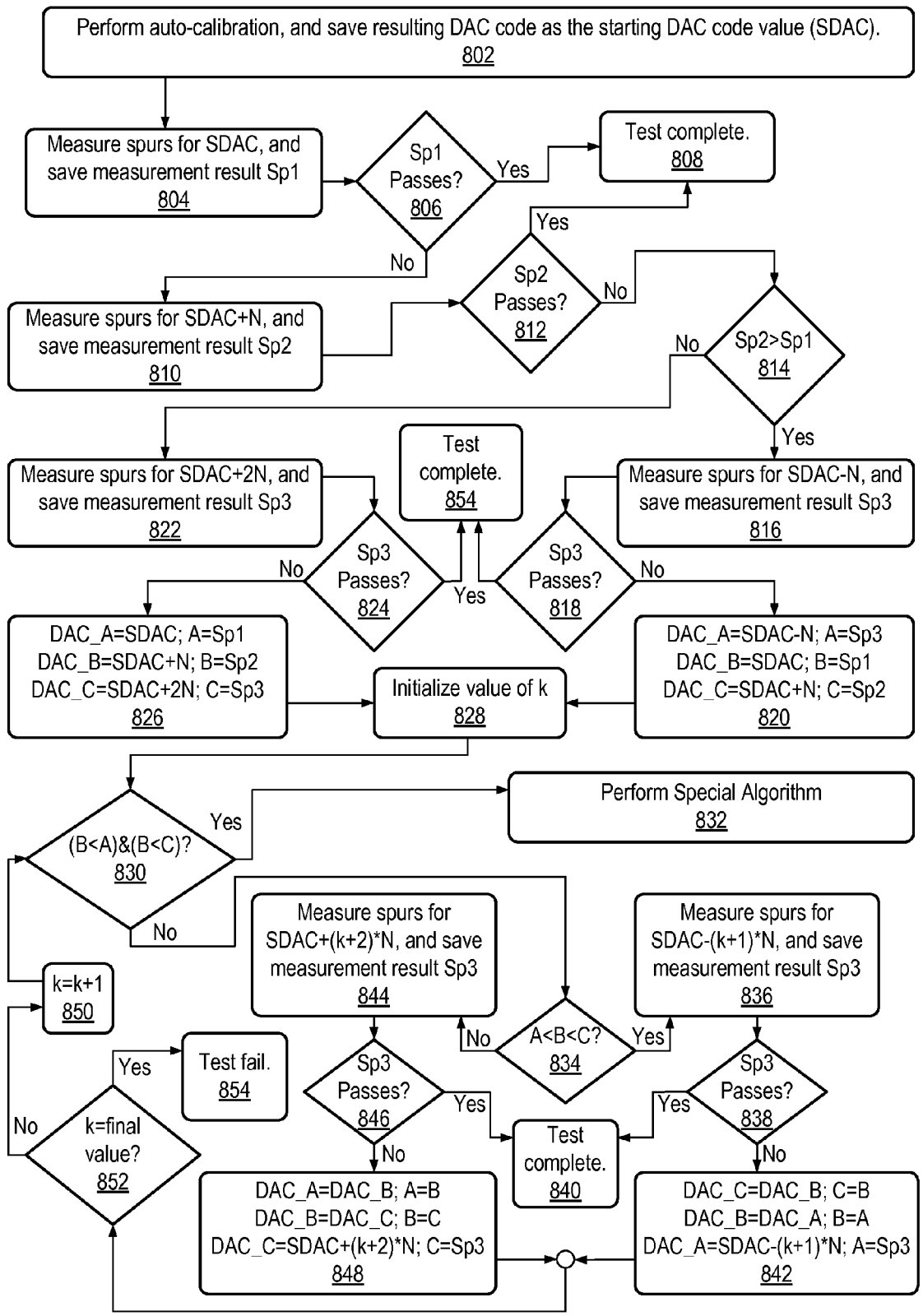
FIG. 8 shows a flow chart of one embodiment of a testing algorithm to obtain a desired DAC code value to trim the DC offset based on RF spur measurements.

FIG. 8 shows a flowchart of one embodiment of an algorithm to find the appropriate DAC code for trimming the DC offset based on FIGS. 7A-7C and the specified values for N and k, by measuring the spur levels at given DC trim levels corresponding to (or associated with) specific DAC codes. Once auto-calibration has been performed, the resulting DAC code is saved, e.g. stored in memory such as memory element 604 in FIG. 6, as the starting DAC code (SDAC) for the algorithm (802). Spurs are then measured at the DC trim resulting from applying the SDAC value to the DAC, and the result of the measurement (i.e. the spur level—Sp1, e.g. in dB) is saved (804). If Sp1 meets the specified emissions requirements ('Yes' branch of 806), then the test is complete (808). Otherwise ('No" branch of 806), spurs are measured at the DC trim resulting from applying an SDAC+N value to the DAC, and the result of the measurement (spur level Sp2) is saved (810). If Sp2 meets the specified emissions requirements ('Yes' branch of 812), then the test is complete (808). Otherwise ('No" branch of 812), Sp2 is compared to Sp1 (814).

If Sp2 is greater than Sp1 ('Yes' branch of 814, indicating a rise in spur level with an increase in the DAC input value, as shown in FIG. 7A), then spurs are measured at the DC trim resulting from applying an SDAC-N value to the DAC, and the result of the measurement (spur level Sp3) is saved (816). If Sp3 meets the specified emissions requirements ('Yes' branch of 818), then the test is complete (854). Otherwise ('No' branch of 818), the DAC value A (DAC_A, which is the DAC Code value corresponding to spur level A in FIGS. 7A-7C) is set to SDAC-N, A (the spur value corresponding to DAC_A) is set to Sp3, DAC value B (DAC_B, which is the DAC Code value corresponding to spur level B in FIGS. 7A-7C) is set to SDAC, B (the spur value corresponding to DAC_B) is set to Sp1, DAC value C (DAC_C, which is the DAC Code value corresponding to spur level C in FIGS. 7A-7C) is set to SDAC+N, and C (the spur value corresponding to DAC_C) is set to Sp2 (820).

If Sp2 is not greater than Sp1 ('No' branch of 814, indicating a decrease in spur level with an increase in the DAC input value, as shown in FIG. 7B), then spurs are measured at the DC trim resulting from applying an SDAC+2N value to the DAC, and the result of the measurement (spur level Sp3) is saved (822). If Sp3 meets the specified emissions requirements ('Yes' branch of 824), then the test is complete (854). Otherwise ('No' branch of 824), DAC_A is set to SDAC, A is set to Sp1, DAC_B is set to SDAC+N, B is set to Sp2, DAC_C is set to SDAC+2N, and C is set to Sp3 (826). Subsequent to either 820 or 826, depending on which branch was taken at 814 based on the measured spur levels, the value of k is initialized (828), and measurements may be taken until k reaches a final specified value, that is, until a specified number of measurements have been taken, or until the test completes, whichever occurs first.

Next, the current values of A, B, and C (i.e. the three currently stored measured spur level values) are compared (830). If B is less than A and less than C ('Yes' branch of 830, indicating the special case shown in FIG. 7C), a special algorithm may be performed to find the notch representing the minimum spur level, and thus obtain the corresponding DAC code value (832). The special algorithm may simply employ a combination of the methodologies used in the cases illustrated in FIGS. 7A and 7B, or it may be a different algorithm. Otherwise ('No' branch of 830), if B is greater than A and less than C ('Yes' branch of 834, indicating case 1 shown in FIG. 7A), then spurs are measured at the DC trim resulting from applying an SDAC−(k+1)*2N value to the DAC, and the result of the measurement (spur level Sp3) is saved (836). If Sp3 meets the specified emissions requirements ('Yes' branch of 838), then the test is complete (840). Otherwise ('No' branch of 838), DAC_C is set to DAC_B, C is set to B, DAC_B is set to DAC_A, B is set to A, DAC_C is set to SDRC−(k+1)*N, and A is set to Sp3 (842). Otherwise ('No' branch of 834, indicating case 2 shown in FIG. 7B), spurs are measured at the DC trim resulting from applying an SDAC+(k+2)*N value to the DAC, and the result of the measurement (spur level Sp3) is saved (844). If Sp3 meets the specified emissions requirements ('Yes' branch of 846), then the test is complete (840). Otherwise ('No' branch of 846), DAC_A is set to DAC_B, A is set to B, DAC_B is set to DAC_C, B is set to C, DAC_C is set to SDAC+(k+2)*N, and C is set to Sp3 (848).

Subsequent to either 842 or 848, depending on which branch was taken at 834 based on the measured spur levels, if the current value of k is the final (specified value), i.e. the specified number of measurements have been taken without finding an acceptable spur level ('Yes' branch of 852), the test halts and indicates a test failure (854). Otherwise ('No' branch of 852), the value of k is increased (850), and the values of A, B, and C are compared according to 830 to obtain further measurements.

As described herein, various embodiments of RF transmitter-receiver circuits, which utilize injection-locked oscillators, introduce a DC offset to correct the RF signal. The DC offset may be adjusted to eliminate (or minimize) even order harmonics to correct for RF effects. Referring again to FIG. 5, various embodiments may be implemented according to certain design considerations. For example, an increase in the injector signal of Injector 214 may facilitate the adjustment of the TxLO bias to increase injection locking bandwidth while reducing core VCO (204) current, thus reducing overall LO (216) current, which may help compensate for increased chip current due to buffer (206 and 208) and calibration (504-528) circuits. Furthermore, the overall current increase during signal transmission may be limited to zero by adjusting the TxLO bias to trade-off injector and core current while maintaining signal swing and injection locking bandwidth. It should also be noted that odd harmonics of the PLL VCO may not be sensitive to duty-cycle, and therefore 9/11 and 13/11 spurs may not be sensitive to device mismatch. The amplitude of the injector signal from Injector 214 may be specified such that the sensitivity of buffer 208 to device mismatch is reduced. In some embodiments, the topology of buffer 206 may be a fully differential current mirror (push-pull) op-amp. A common-mode feedback loop may be added to control common-mode output voltage, which facilitates maintaining the gain of the block over process corners and mismatch, during DC offset calibration. Device ratios may be optimized and the output stage may be increased in width to reduce output impedance of the driver.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for reducing spurs in an injection locked oscillator (ILO), the method comprising:
   generating a periodic source signal;
   generating an injection signal based on the periodic source signal, wherein the injection signal is a specified harmonic of the periodic source signal, and wherein the injection signal has a duty-cycle value;
   generating a carrier signal by locking a target periodic signal to a specified frequency and phase of the injection signal; and
   reducing spurious emissions around the specified harmonic of the periodic source signal by adjusting the duty-cycle value of the injection signal, said adjusting the duty-cycle value comprising adjusting a voltage offset created in a differential signal path of the injection signal.

2. The method of claim 1, wherein the voltage offset is a direct current (DC) voltage offset.

3. The method of claim 1, wherein said adjusting the voltage offset comprises introducing a known voltage offset in the input of a buffer providing the periodic source signal.

4. The method of claim 1, wherein said generating the injection signal comprises passing the periodic source signal through a filter tuned to the specified harmonic of the periodic source signal, the output of the filter providing the injection signal.

5. The method of claim 1, wherein said generating the periodic source signal is performed by a phase-locked loop (PLL).

6. The method of claim 1, wherein said adjusting the voltage offset comprises adjusting the voltage offset until a specified voltage offset value is reached.

7. The method of claim 1, wherein the specified harmonic is an odd harmonic, and wherein the spurious emissions around the specified harmonic are even harmonics.

8. A circuit for reducing spurs in an injection locked oscillator (ILO), the circuit comprising:
   a first element configured to measure a voltage offset created in a differential signal path of an injection signal of the ILO, and further configured to generate an enable signal based on the measured voltage offset, wherein the injection signal is a specified harmonic of a periodic source signal of the ILO; and
   a second element configured to receive the enable signal, and when enabled by the enable signal, adjust a duty cycle value of the injection signal by adjusting the voltage offset to reduce spurious emissions around a specified harmonic of the periodic source signal.

9. The circuit of claim 8, wherein the first element is a comparator having a pair of differential inputs configured to couple to a pair of differential outputs of a first component of the ILO providing the periodic source signal.

10. The circuit of claim 8, wherein the second element comprises a digital to analog converter (DAC) having a pair of differential outputs configured to couple to a pair of differential inputs of a first component of the ILO to introduce a known voltage offset in the pair of differential inputs of the first component, wherein the first component has a pair of differential outputs providing the periodic source signal.

11. The circuit of claim 10, wherein the DAC is configured to adjust the voltage offset by increasing the introduced known voltage offset by a specified increment until the measured voltage offset reaches a specified value.

12. The circuit of claim 11, wherein the specified value is zero volts DC (direct current).

13. The circuit of claim 10, wherein the first component is a hard limiting buffer.

14. The circuit of claim 10, wherein the second element further comprises a counter configured to generate a code value input into the DAC, wherein known voltage offset corresponds to the code value.

15. An injection locked oscillator (ILO) system comprising:
- a phase locked loop (PLL) configured to generate a periodic source signal, the PLL comprising a first buffer having a pair of differential outputs configured to provide the periodic source signal;
- a filter tuned to a specified harmonic of the periodic source signal to generate an injection signal based on the periodic source signal;
- a local oscillator configured to lock to the injection signal to generate a carrier signal; and
- a control circuit configured to adjust a duty cycle value of the injection signal by adjusting a voltage offset created in a differential signal path between the pair of differential outputs of the first buffer and the local oscillator, to reduce spurious emissions around the specified harmonic of the periodic source signal.

16. The ILO system of claim 15, further comprising a high gain buffer coupled between the pair of differential outputs of the first buffer and the filter, to gain up the periodic source signal.

17. The ILO system of claim 15, further comprising a voltage controlled oscillator configured to generate a base periodic signal and provide the base periodic signal to the first buffer, wherein the first buffer is configured to generate the periodic source signal based on the base periodic signal.

18. The ILO system of claim 15, wherein the control circuit is configured to adjust the voltage offset until the voltage offset reaches a specified desired value.

19. The ILO system of claim 15, further comprising a host system configured to instruct the control circuit to adjust the voltage offset during a startup of the ILO system as part of an auto calibration routine.

20. The ILO system of claim 15, wherein the control circuit comprises a digital to analog converter (DAC) having a pair of differential outputs coupled to the pair of differential inputs of the first buffer, and configured to introduce a first voltage offset in the pair of differential inputs of the first buffer to adjust the voltage offset at the pair of differential outputs of the first buffer.

21. The ILO system of claim 20, wherein the DAC is configured to receive a code value and introduce the first voltage offset corresponding to the code value.

22. The ILO system of claim 21, wherein the DAC is configured to receive a different code value until the voltage offset at the pair of differential outputs of the first buffer reaches a specified level.

23. The ILO system of claim 21, further comprising a host system configured to instruct the control circuit to perform an auto calibration routine that comprises the DAC receiving different code values and introducing different corresponding first offset voltages in the pair of differential inputs of the first buffer until the voltage offset at the pair of differential outputs of the first buffer reaches a specified level.

24. The ILO system of claim 23, further comprising a register configured to store a given code value received by the DAC and corresponding to a given first voltage offset that results in the voltage offset at the pair of differential outputs of the first buffer reaching the specified level.

25. The ILO system of claim 24, further comprising a test circuit configured to:
- measure the spurious emissions around the specified harmonic of the periodic source signal for the stored given code value; and
- if the measured spurious emissions do not fall within specified acceptable limits, provide a different code value to the DAC and measure the spurious emissions around the specified harmonic of the periodic source signal for the different code value, until a desired code value is identified for which the measured spurious emissions fall within specified acceptable limits.

* * * * *